United States Patent
Neufeld et al.

(10) Patent No.: US 6,665,832 B1
(45) Date of Patent: Dec. 16, 2003

(54) SLOTTED MODE DECODER STATE METRIC INITIALIZATION

(75) Inventors: Arthur James Neufeld, San Diego, CA (US); Gwain Bayley, Carlsbad, CA (US)

(73) Assignee: Qualcomm, Incorporated, San Diego, CA (US)

( * ) Notice: Subject to any disclaimer, the term of this patent is extended or adjusted under 35 U.S.C. 154(b) by 0 days.

(21) Appl. No.: 09/539,852

(22) Filed: Mar. 31, 2000

(51) Int. Cl.[7] .................. H03M 13/03; H03D 1/00; H04L 27/06
(52) U.S. Cl. ...................... 714/786; 375/341
(58) Field of Search ................. 714/786, 796, 714/794, 795; 375/341

(56) References Cited

U.S. PATENT DOCUMENTS

| | | | | |
|---|---|---|---|---|
| 4,583,078 A | * | 4/1986 | Shenoy et al. ............ | 341/51 |
| 5,355,376 A | * | 10/1994 | Cox et al. ................ | 714/795 |
| 5,440,572 A | | 8/1995 | Kitaori | |
| 5,673,291 A | | 9/1997 | Dent | |
| 5,710,784 A | * | 1/1998 | Kindred et al. ........... | 375/262 |
| 5,875,214 A | | 2/1999 | Urbaniak et al. | |
| 5,878,098 A | * | 3/1999 | Wang et al. ............. | 375/377 |
| 5,974,091 A | * | 10/1999 | Huff .................... | 375/265 |
| 6,044,069 A | | 3/2000 | Wan | |
| 6,434,203 B1 | * | 8/2002 | Halter ................... | 375/341 |
| 6,452,984 B1 | * | 9/2002 | Banister et al. .......... | 375/341 |

FOREIGN PATENT DOCUMENTS

| | | |
|---|---|---|
| EP | 0660534 | 6/1995 |
| EP | 0671836 | 9/1995 |
| EP | 0782277 | 7/1997 |
| EP | 0909038 | 4/1999 |
| WO | 0004738 | 1/2000 |

OTHER PUBLICATIONS

International Search Report, mailed Jun. 12, 2001.

Ranpara, et al., *A Low–Power Viterbi Decoder Design for Wireless Communications Applications*: ASIC/SOC CONFERENCE, 1999. PROCEEDINGS. 12th Annual IEEE International Washington, DC, USA, pp. 377–381.

* cited by examiner

*Primary Examiner*—Phung M. Chung
*Assistant Examiner*—Joseph D. Torres
(74) *Attorney, Agent, or Firm*—Philip R. Wadsworth; Charles D. Brown; Howard H. Seo (57) ABSTRACT

A method and apparatus for improving the performance of a convolutional encoder used in a slotted mode communication system. In a typical slotted mode communication system a stream of continuously convolutionally encoded symbols is transmitted by a base station. A remote unit, comprising a convolutional decoder to decode the stream of symbols periodically transits between active and inactive states. While in the inactive state the remote unit misses a portion of the continuous stream of symbols. Following the interruption of the stream of symbols, the state metrics of a trellis within the decoder are initialized. Initialization of the state metrics may be such that the decoding process will be biased towards only valid states and away from invalid states. In addition, the initialization may be such that there is not a bias towards any particular state within the trellis.

26 Claims, 10 Drawing Sheets

SLOTTED MODE DECODER STATE METRIC INITIALIZATION

The following U.S. Patent Application filed concurrently herewith, is related to this application and is hereby incorporated by reference in its entirety: SYMBOL COMBINER SYNCHRONIZATION AFTER A JUMP TO A NEW TIME ALIGNMENT, U.S. patent application Ser. No. 09/540,302.

FIELD OF THE INVENTION

The invention relates to wireless communications systems. In particular, the invention relates to initialization of a convolutional decoder that has missed a portion of a continuously encoded symbol stream.

BACKGROUND OF THE INVENTION

Figure 1:
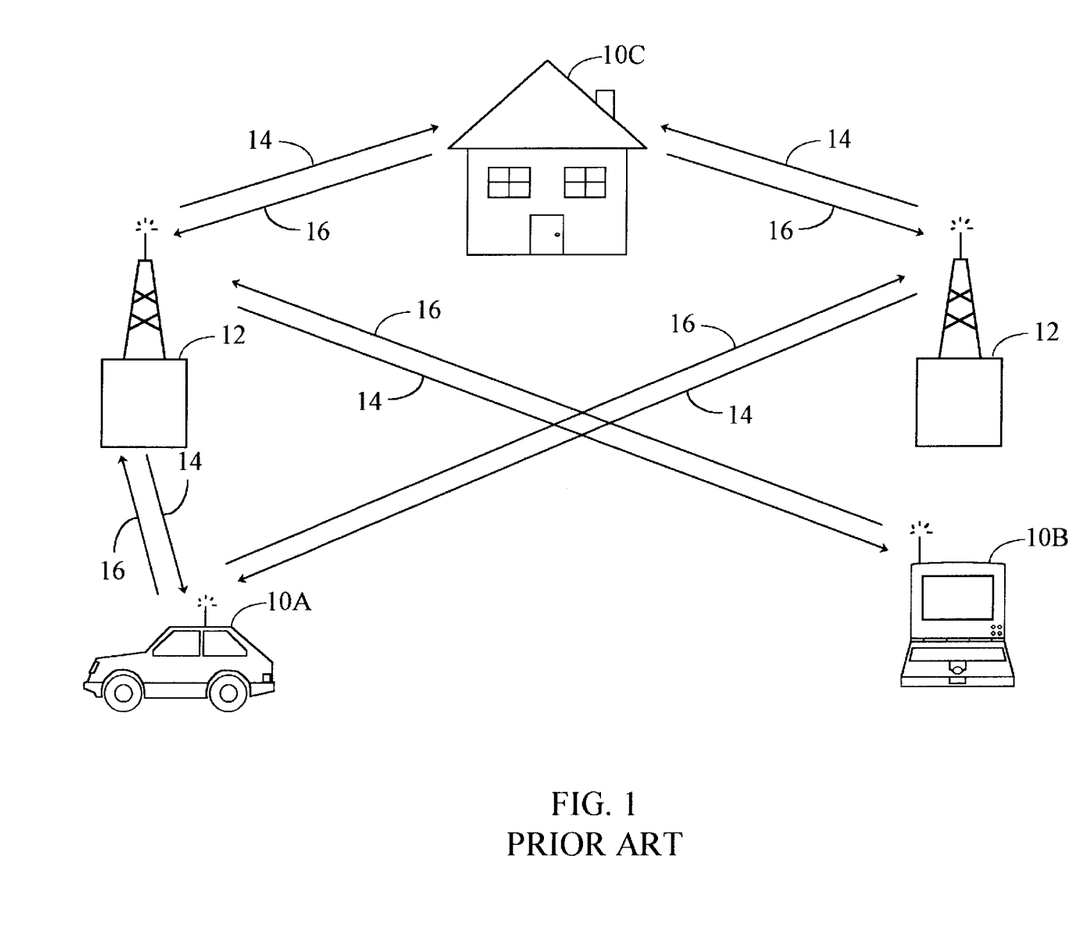
FIG. 1 is a representative diagram showing a typical modern wireless communication system.

A wireless communication system may comprise multiple remote units and multiple base stations. FIG. 1 exemplifies an embodiment of a terrestrial wireless communication system with three remote units 10A, 10B and 10C and two base stations 12. In FIG. 1, the three remote units are shown as a mobile telephone unit installed in a car 10A, a portable computer remote 10B, and a fixed location unit 10C such as might be found in a wireless local loop or meter reading system. Remote units may be any type of communication unit such as, for example, hand-held personal communication system units, portable data units such as a personal data assistant, or fixed location data units such as meter reading equipment. FIG. 1 shows a forward link 14 from the base station 12 to the remote units 10 and a reverse link 16 from the remote units 10 to the base stations 12.

Communication between remote units and base stations, over the wireless channel, can be accomplished using one of a variety of multiple access techniques which facilitate a large number of users in a limited frequency spectrum. These multiple access techniques include time division multiple access (TDMA), frequency division multiple access (FDMA), and code division multiple access (CDMA). An industry standard for CDMA is set forth in the TIA/EIA Interim Standard entitled "Mobile Station—Base Station Compatibility Standard for Dual-Mode Wideband Spread Spectrum Cellular System", TIA/EIA/IS-95, and its progeny (collectively referred to here as IS-95), the contents of which are incorporated by reference herein in their entirety. Additional information concerning a CDMA communication system is disclosed in U.S. Pat. No. 4,901,307, entitled SPREAD SPECTRUM MULTIPLE ACCESS COMMUNICATION SYSTEM USING SATELLITE OR TERRESTRIAL REPEATERS, (the '307 patent) assigned to the assignee of the present invention and incorporated in its entirety herein by reference.

In the '307 patent, a multiple access technique is disclosed where a large number of mobile telephone system users, each having a transceiver, communicate through base stations using CDMA spread spectrum communication signals. The CDMA modulation techniques disclosed in the '307 patent offer many advantages over other modulation techniques used in wireless communication systems such as TDMA and FDMA. For example, CDMA permits the frequency spectrum to be reused multiple times, thereby permitting an increase in system user capacity. Additionally, use of CDMA techniques permits the special problems of the terrestrial channel to be overcome by mitigation of the adverse effects of multipath, e.g. fading, while also exploiting the advantages thereof.

In a wireless communication system, a signal may travel several distinct propagation paths as it propagates between base stations and remote units. The multipath signal generated by the characteristics of the wireless channel presents a challenge to the communication system. One characteristic of a multipath channel is the time spread introduced in a signal that is transmitted through the channel. For example, if an ideal impulse is transmitted over a multipath channel, the received signal appears as a stream of pulses. Another characteristic of the multipath channel is that each path through the channel may cause a different attenuation factor. For example, if an ideal impulse is transmitted over a multipath channel, each pulse of the received stream of pulses generally has a different signal strength than other received pulses. Yet another characteristic of the multipath channel is that each path through the channel may cause a different phase on the signal. For example, if an ideal impulse is transmitted over a multipath channel, each pulse of the received stream of pulses generally has a different phase than other received pulses.

In the wireless channel, the multipath is created by reflection of the signal from obstacles in the environment such as, for example, buildings, trees, cars, and people. Accordingly, the wireless channel is generally a time varying multipath channel due to the relative motion of the structures that create the multipath. For example, if an ideal impulse is transmitted over the time varying multipath channel, the received stream of pulses changes in time delay, attenuation, and phase as a function of the time that the ideal impulse is transmitted.

The multipath characteristics of a channel can affect the signal received by the remote unit and result in, among other things, fading of the signal. Fading is the result of the phasing characteristics of the multipath channel. A fade occurs when multipath vectors add destructively, yielding a received signal that is smaller in amplitude than either individual vector. For example if a sine wave is transmitted through a multipath channel having two paths where the first path has an attenuation factor of X dB, a time delay of $\delta$ with a phase shift of $\Theta$ radians, and the second path has an attenuation factor of X dB, a time delay of $\delta$ with a phase shift of $\Theta+\pi$ radians, no signal is received at the output of the channel because the two signals, being equal amplitude and opposite phase, cancel each other. Thus, fading may have a severe negative effect on the performance of a wireless communication system.

Typically, modern communication systems use coding to improve immunity to interference and wireless channel noise. Additionally, coding may increase system capacity and improve security. Generally, an information signal is first converted into a form suitable for efficient transmission over the wireless channel. Conversion or modulation of the information signal involves varying a parameter of a carrier wave on the basis of the information signal in such a way that the spectrum of the resulting modulated carrier is confined within the channel bandwidth. At a remote unit, the original message signal is replicated from a version of the modulated carrier received following propagation over the wireless channel. Such replication is generally achieved by using an inverse of the modulation process employed by the base station.

The field of data communications is particularly concerned with optimizing data throughput of a transmission system with a limited signal to noise ratio (SNR). The use of error correcting circuitry, such as encoders and decoders, allows system tradeoffs to be made. For example, smaller SNRs or higher data rates may be used with a particular wireless channel which maintains the same bit error rate (BER).

One class of encoders is known as a convolutional encoder. As is well known in the art, a convolutional encoder converts a sequence of input data bits to a codeword based on a convolution of the input sequence with itself or with another signal. Convolutional encoding of data combined with a convolutional decoder is a well known technique for providing error correction coding and decoding of data. One type of convolutional decoder typically used is a Viterbi decoder.

Coding rate, constraint length, and generating polynomials are used to define a convolutional decoder. A coding rate (k/n) corresponds to the number of coding symbols produced (n) for a given number of input bits (k). A constraint length (K) is defined as the length of a shift register used in convolutional encoding of data. Convolutional codes add correlation to an input data sequence by using delay elements (i.e., shift registers) and modulo adders. Taps between the delay elements may terminate at modulo adders forming a desired generating polynomial.

Figure 2:
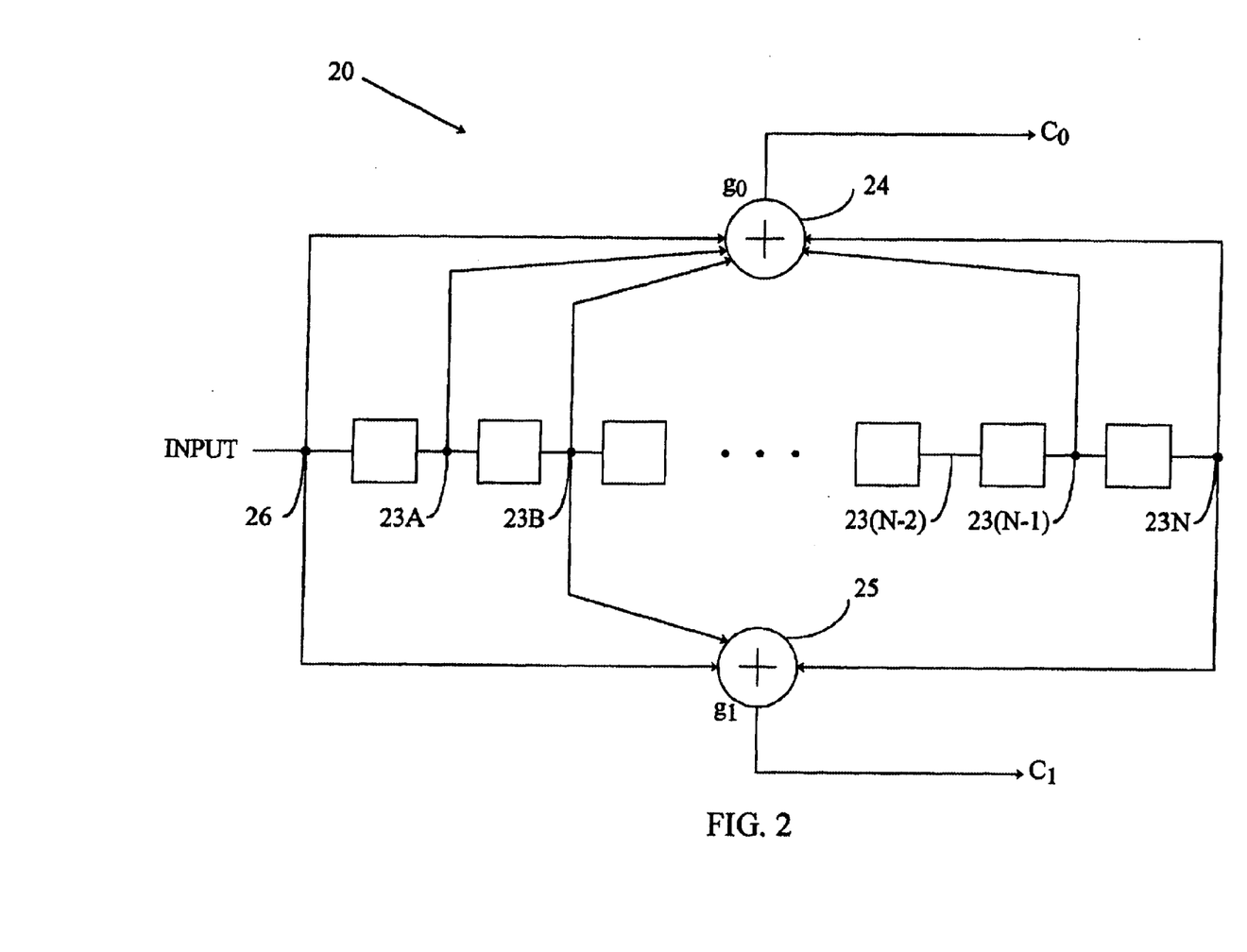
FIG. 2 is a block diagram of a convolutional decoder.

FIG. 2 is a block diagram of a convolutional encoder 20. The encoder 20 shown contains a shift register 22 tapped at various positions 23A through 23N. The shift register taps terminate at one or more of the modulo-2 adders 24 and 25 forming generator functions $g_0$ and $g_1$. Different generating polynomials can be formed by the selection of which taps terminate at the modulo-2 adders.

Bits enter the encoder at its input 26 one at a time. The outputs of the generator functions are the encoded output symbols $C_0$ and $C_1$. Each of the two generator functions $g_0$ and $g_1$ produces an output symbol for each input bit, which corresponds to a code rate of ½. For an encoder with three generator functions, the code rate is ⅓ and a code rate of ¹/n requires n generator functions.

A coding rate of ½ has become one of the most popular rates, although other code rates may be used. A constraint length of nine (K=9) is typical in convolutional coding schemes. The convolutional encoder can be thought of as a Finite Impulse Response filter with binary coefficients and length K-1. This filter produces a symbol stream with $2^{K-1}$ possible states.

A basic principle of the Viterbi algorithm is to take a convolutionally encoded data stream that has been transmitted over a noisy wireless channel and use a finite state machine to efficiently determine the most likely sequence that was transmitted. A K=9 Viterbi decoder can be thought of as a machine that hypothesizes which of each 256 ($2^{(K-1)}$) possible states the encoder could have been in given the symbols received. The probability that the encoder transitioned from each of those states to the next set of 256 possible encoder states is determined. The probabilities are represented by quantities called metrics, which are proportional to the negative of the logarithm of the probability. The sum of the metrics is therefore equivalent to the reciprocal of the product of the probabilities. Thus, smaller metrics correspond to higher probability events.

There are two types of metrics: state metrics, sometimes called path metrics; and branch metrics. The state metric represents the probability that the received set of symbols leads to the state with which it is associated. The branch metric represents the conditional probability that the transition from one state to another occurred assuming that the starting state was actually the correct state and given the symbol that was actually received.

In a rate ¹/N encoder, there are two possible states leading to any other state, each corresponding to the occurrence of a zero or a one in the right-most bit of the convolutional encoder shift register. The decoder decides which is the more likely state by an add-compare-select (ACS) operation. Add refers to adding each state metric at the preceding level to the two branch metrics of the branches for the allowable transitions. Compare refers to comparing the pair of such metric sums for paths entering a state (node) at the given level. Select refers to selecting the lesser of the two and discarding the other. Thus, only the winning branch, i.e., the branch with the highest probability (smallest metric), is preserved at each node, along with the node state metric. If the two quantities being compared are equal, either branch may be selected, for the probability of erroneous selection will be the same in either case.

The Viterbi algorithm is a computationally efficient method of updating the conditional probabilities of the best state and the most probable bit sequence transmitted from the possible $2^{K-1}$ states. In order to compute this probability, all $2^{K-1}$ states for each bit must be computed. The resulting decision bits from each of these computations is stored as a single bit in a path memory.

A chain-back operation, an inverse of the encoding operation, is performed in which the C decision bits are used to select an output bit, where C is the chainback distance. After many branches the most probable path will be selected with a high degree of certainty. The path memory depth must be sufficiently long to be governed by the signal-to-noise ratio and not the length of the chain-back memory.

Though it is not necessary for analyzing either the code characteristics or the performance of the optimal decoder, it is useful in understanding both to exhibit the code on a trellis diagram. The term "trellis" is a term which describes a tree in which a branch not only bifurcates into two or more branches but also in which two or more branches can merge into one. A trellis diagram is an infinite replication of the state diagram for an encoder. The nodes (states) at one level in the trellis are reached from the node states of the previous level by the transition through one branch, corresponding to one input bit, as determined by the state diagram. Any codeword of a convolutional code corresponds to the symbols along a path (consisting of successive branches) in the trellis diagram.

Figure 3:
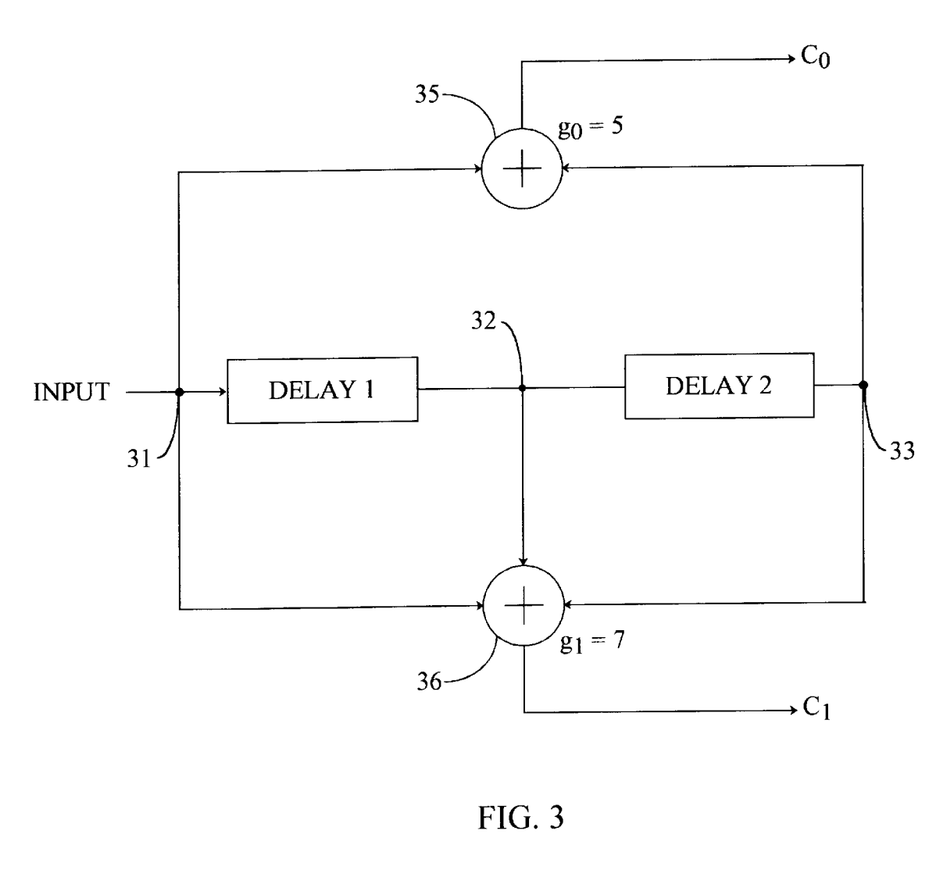
FIG. 3 is a block diagram of a rate +e,fra 2+ee, constraint length 3, convolutional encoded.

A simple embodiment of the encoder of FIG. 2 is illustrated in FIG. 3. FIG. 3 illustrates a convolutional encoder with a code rate of ½ and a constraint length of 3. As shown in FIG. 3, the convolutional encoder has three taps 31, 32 and 33. The taps terminate at two modulo 2 adders 35 and 36 forming generator functions $g_0=5_{10}$ and $g_1=7_{10}$. The output of the generator functions become the encoded output symbols $C_0$ and $C_1$, respectively.

Figure 4:
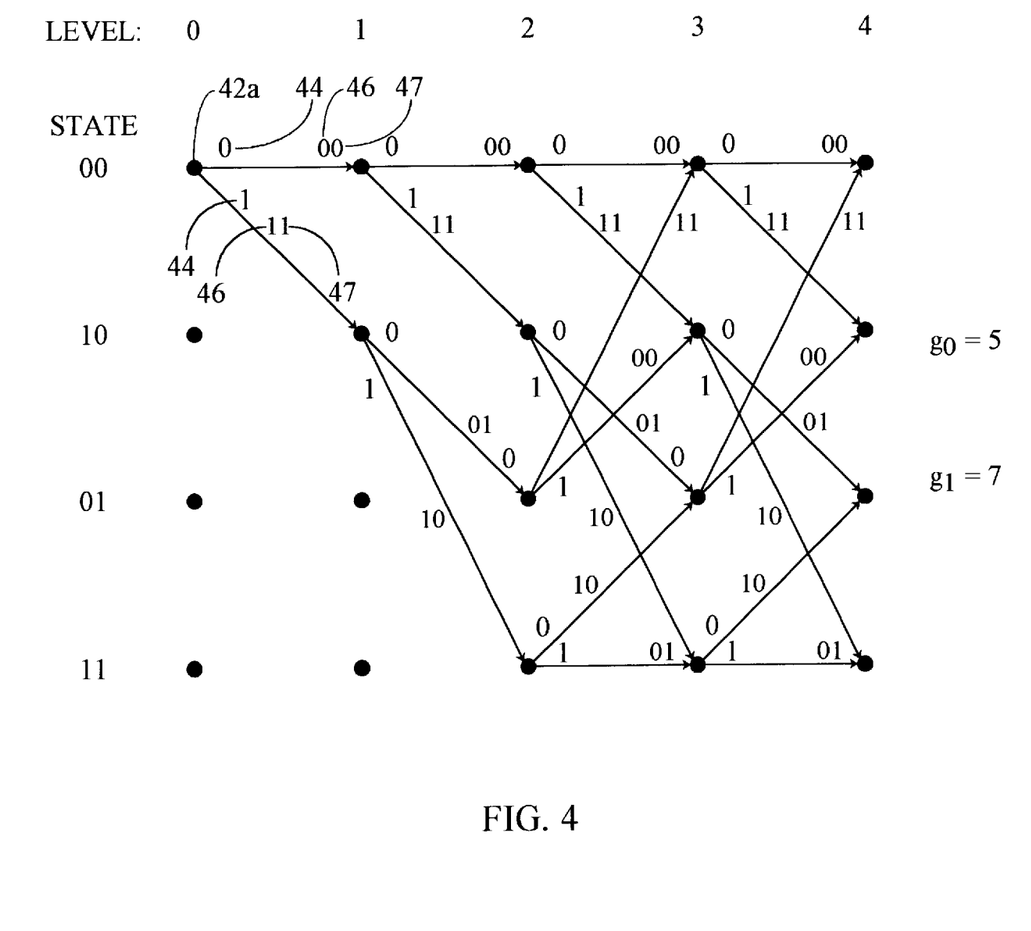
FIG. 4 is a trellis diagram showing the possible paths of the convolutional encoder illustrated in FIG. 3.

FIG. 4 is a trellis diagram showing the possible paths of the convolutional encoder illustrated in FIG. 3. The encoder is assumed to begin in the zero state. Each possible state is represented in the trellis diagram by a node 42. In each state the next input bit into the encoder may be either a zero or a one and a corresponding set of symbols are generated in each generator function. In FIG. 4, input bits 44 at each state are represented on their associated path. The output code symbols C0, indicated as 46, and C1, indicated as 47, generated from the input of each bit are represented in the diagram on the associated path. As illustrated in this simple example, each set of code symbols received at the remote unit is influenced from previously input data bits at the encoder. Thus, in typical operation, a convolutional decoder receives a continuous uninterrupted stream of code symbols with each symbol influenced by the preceding input data.

In a typical CDMA communication system, remote units only sporadically establish bidirectional communication with a base station. For example, a cellular telephone remains idle for significant periods of time when no call is in process. To ensure that any message directed to a remote unit is received, the remote unit must continuously monitor the communication channel even while it is idle. For example, while idle, the remote unit monitors the forward link channel from the base station to detect incoming calls. During such idle periods, the cellular telephone continues to consume power to sustain the elements necessary to monitor for signals from the base stations. Many remote units are portable and are powered by an internal battery. For example, personal communication system (PCS) handsets are almost exclusively battery-powered. The consumption of battery resources by the remote unit in idle mode decreases the battery resources available to the remote unit when a call is placed or received. Therefore, it is desirable to minimize power consumption in a remote unit in the idle state and thereby increase battery life.

One means of reducing remote unit power consumption in a communication system is disclosed in U.S. Pat. No. 5,392,287, entitled APPARATUS AND METHOD FOR REDUCING POWER CONSUMPTION IN A MOBILE COMMUNICATION RECEIVER (the '287 patent), assigned to the assignee of the present invention and hereby incorporated in its entirety herein by reference. In the '287 patent, a technique for reducing power consumption in a remote unit operating in an idle mode (i.e. a remote unit which is not engaged in bidirectional communication with a base station) is disclosed. In idle, each remote unit periodically enters an "active" state during which it prepares to and receives messages on a forward link communication channel. In the time period between successive active states, the remote unit enters an "inactive" state. During the remote unit's inactive state, the base station does not send any messages to that remote unit, although it may send messages to other remote units in the system that are in the active state.

As disclosed in the '287 patent, a base station broadcast messages which are received by all remote units within the base station coverage area on a "paging channel." All idle remote units within the base station coverage area monitor the paging channel. The paging channel is divided in the time dimension into a continuous stream of "slots." Each remote unit operating in slotted mode monitors only specific slots which have been assigned to it as active (assigned) slots. The paging channel continually transmits convolutional encoded messages in numbered slots, repeating the slot sequence, such as for example, every 640 slots. When a remote unit enters the coverage area of a base station, or if a remote unit is initially powered on, it communicates its presence to a preferred base station. Typically the preferred base station is the base station which has the strongest pilot signal as measured by the remote unit.

The preferred base station, along with a plurality of geographically near neighboring base stations, assign a slot, or a plurality of slots, within their respective paging channels, for the remote unit to monitor. The base station uses the slots in the paging channel to transmit control information to a remote unit, if necessary. The remote unit may also monitor a timing signal from the preferred base station allowing the remote unit to align, in the time dimension, to the base station slot timing. By aligning in the time dimension to the preferred base station slot timing, the remote unit can determine when a paging channel slot sequence begins. Thus, knowing when the paging channel slot sequence begins, which slots are assigned for it to monitor, the total number of slots in the repetitive paging channel sequence of slots, and the period of each slot, the remote unit is able to determine when its assigned slots occur.

Generally, the remote unit is in the inactive state while the base station is transmitting on the paging channel in slots which are not within the remote unit's assigned set. While in the inactive state, the remote unit does not monitor timing signals transmitted by the base station, maintaining slot timing using an internal clock source. Additionally, while in the inactive state the remote unit may remove power and/or clocks from selected circuitry, such as, for example, circuits which monitor the wireless channel and the decoder. Using its internal timing, the remote unit transits to its active state a short period of time before the next occurrence of an assigned slot.

When transiting to the active state, the remote unit applies power to circuitry that monitors the wireless channel. After the remote unit has reacquired the base station, the remote unit begins receiving a stream of coded symbols and clocks the coded symbols into the decoder. The decoder uses the coded symbols to continue building a trellis stored in the decoder. However, because the stream of coded symbols has been interrupted, the symbol codes being received by the remote unit have no relationship to the symbols that built the trellis stored within the decoder. Therefore the remote unit must receive sufficient code symbols prior to its assigned slot to ensure that proper decoding of the code word is accomplished. For example, the paging channel used in IS-95 is continuously encoded with a constraint length 9 convolutional code. A decoder used to decode the IS-95 paging channel may need to decode 116 data bits to properly initialize its state metrics and insure valid data is output from the decoder.

When the remote unit enters the active state, it may receive messages in its assigned slots in the paging channel and respond to commands from the base station. For example, the remote unit may be commanded to activate a "traffic" channel to establish a bi-directional communication link for conducting subsequent voice communication in response to an incoming call. If there is no message from the base station, or no command requesting the remote unit to remain active, at the end of the assigned slot the remote unit returns to the inactive state. In addition, the remote unit returns to the inactive state immediately if commanded to do so by the base station.

Therefore, there is a need in the art for a method and apparatus to decrease the number of code symbols required to properly decode an interrupted stream of code words.

SUMMARY OF THE INVENTION

The invention addresses these and other needs by providing a system and method wherein the convergence of a convolutional decoder is improved. In one aspect of the invention, the remote unit comprising the convolution decoder receives an interrupted stream of code symbols. Prior to decoding the symbols, the state metrics of the trellis residing within the decoder are initialized.

In one aspect of the invention, when the remote unit receives the interrupted stream of code symbols, the pattern of code symbols transmitted just prior to the code symbols received are known. The state metrics of the trellis are then biased towards states which would have been valid only if the previous code symbols would have been received. The remaining invalid states of the trellis are initialized with a high state metric. Therefore, during the decoding process, the decoder is biased toward the valid states.

In another aspect of the invention, the metrics of all states in the trellis residing in the encoder are initialized to 0 or some other constant value. Therefore, there is not a bias towards any particular state within the trellis.

BRIEF DESCRIPTION OF THE DRAWINGS

The features, objects and advantages of the present invention will become more apparent from the detailed description set forth below when taken in conjunction with the drawings in which like references characters identify correspondingly throughout, and wherein.

DETAILED DESCRIPTION OF THE INVENTION

Figure 5:
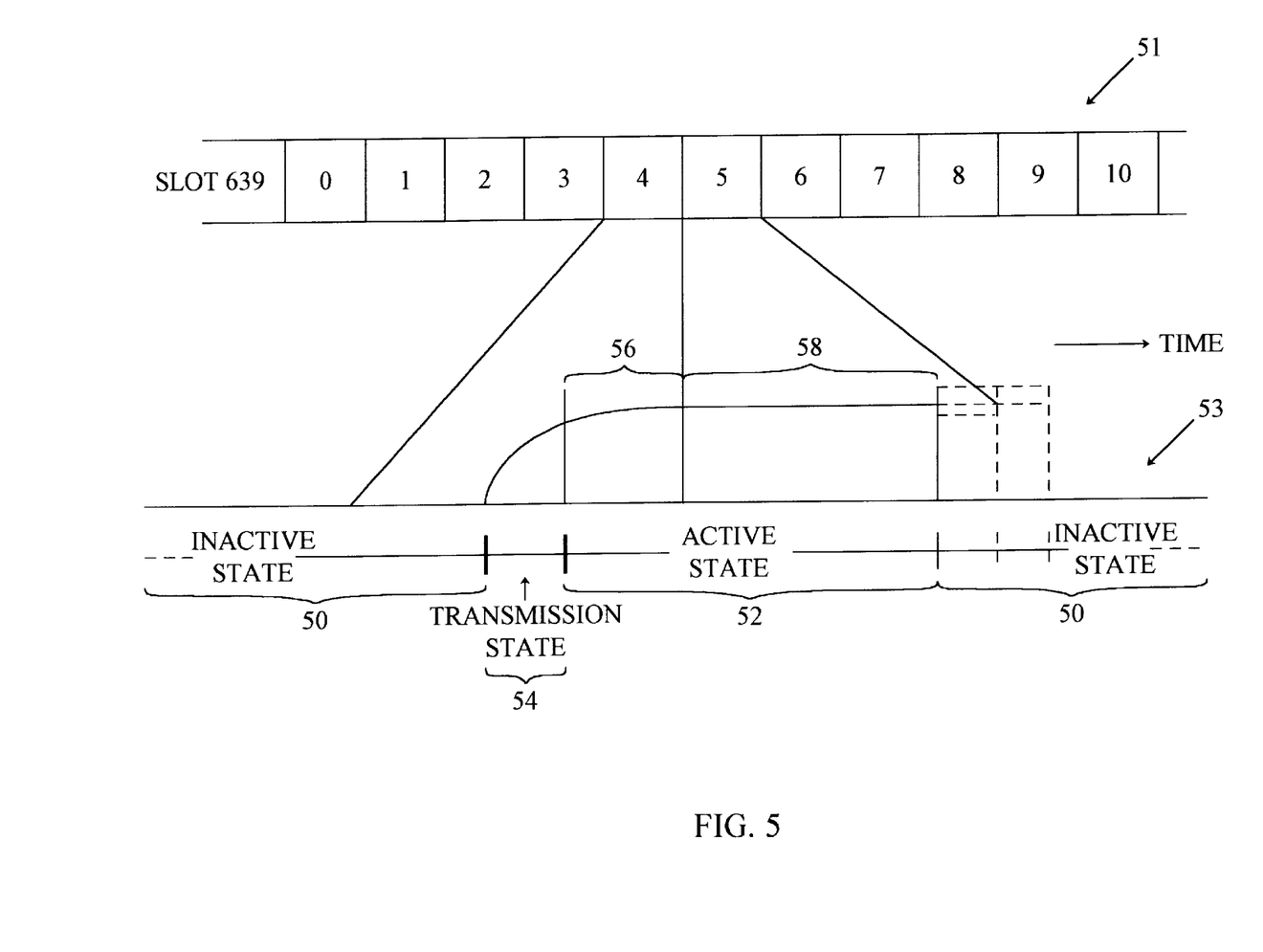
FIG. 5 is a representative diagram illustrating the transition from the inactive state to the active state at the assigned slot of a remote unit in a slotted mode communication system.

FIG. 5 is a representative diagram illustrating the transition from the inactive state to the active state at the assigned slot of a remote unit in a slotted mode communication system. An upper potion 51 represents a continual sequence of slots which flow in time from left to right. The lower portion 52 represents events occurring during a transition between active and inactive states of a remote unit in a slotted mode communication system in which slot 5 is an assigned slot. The time scale for the lower portion has been expanded so that the transition can be shown in more detail.

In particular, the lower portion 53 of FIG. 5 shows the transition from an inactive state 50 to an active state 52. In the active state 52, the remote unit monitors the base station signal during at least a portion of slot 5. Prior to the start of slot 5, the remote unit transits from the inactive state 50 to the active state 52 through a transition state 54. As described above, in the inactive state 50, selected circuitry in the remote unit is unpowered, reducing power consumption and extending battery life of the remote unit. For example, power may be removed from the receiver during the inactive state 50.

During the transition state 54, power is reapplied to the selected circuitry of the remote unit. For example, if the receiver is unpowered, power is reapplied in the transition state 54. The duration of the transition state 54 is sufficient to allow the remote unit to power on circuits and initialize functions so that the remote unit is functional, allowing it to receive and decode codewords at the end of the transition state 54.

Following the transition state 54, the remote unit enters the active state 52. The active state 52 is made up of two parts: a preparation period 56 and an assigned slot period 58. During the preparation period 56, an initial search is performed for reacquiring the pilot signal of the preferred base station so that the remote unit is prepared to monitor the paging channel during the assigned slot period 58. The assigned slot period 58 begins at the beginning of slot 5.

During the assigned slot period 58, the remote unit receives messages on the paging channel from the preferred base station. Nominally, at the completion of slot 5, the assigned slot period 58 and the active state 52 terminate and the remote unit enters the inactive state 50. In order to further reduce the power consumption of the remote unit, the base station may command the remote unit to enter the inactive state 50 before the completion of slot 5. Alternatively, if the base station cannot complete the transfer of messages during slot 5, the base station may command the remote unit to remain in the assigned slot period 58 after the completion of the slot 5. Subsequently, the base station commands the remote unit to enter the inactive state 50. The remote unit stops receiving transmitted data upon entering the inactive state 50 interrupting the continuously convolutionally encoded symbol stream.

Figure 6:
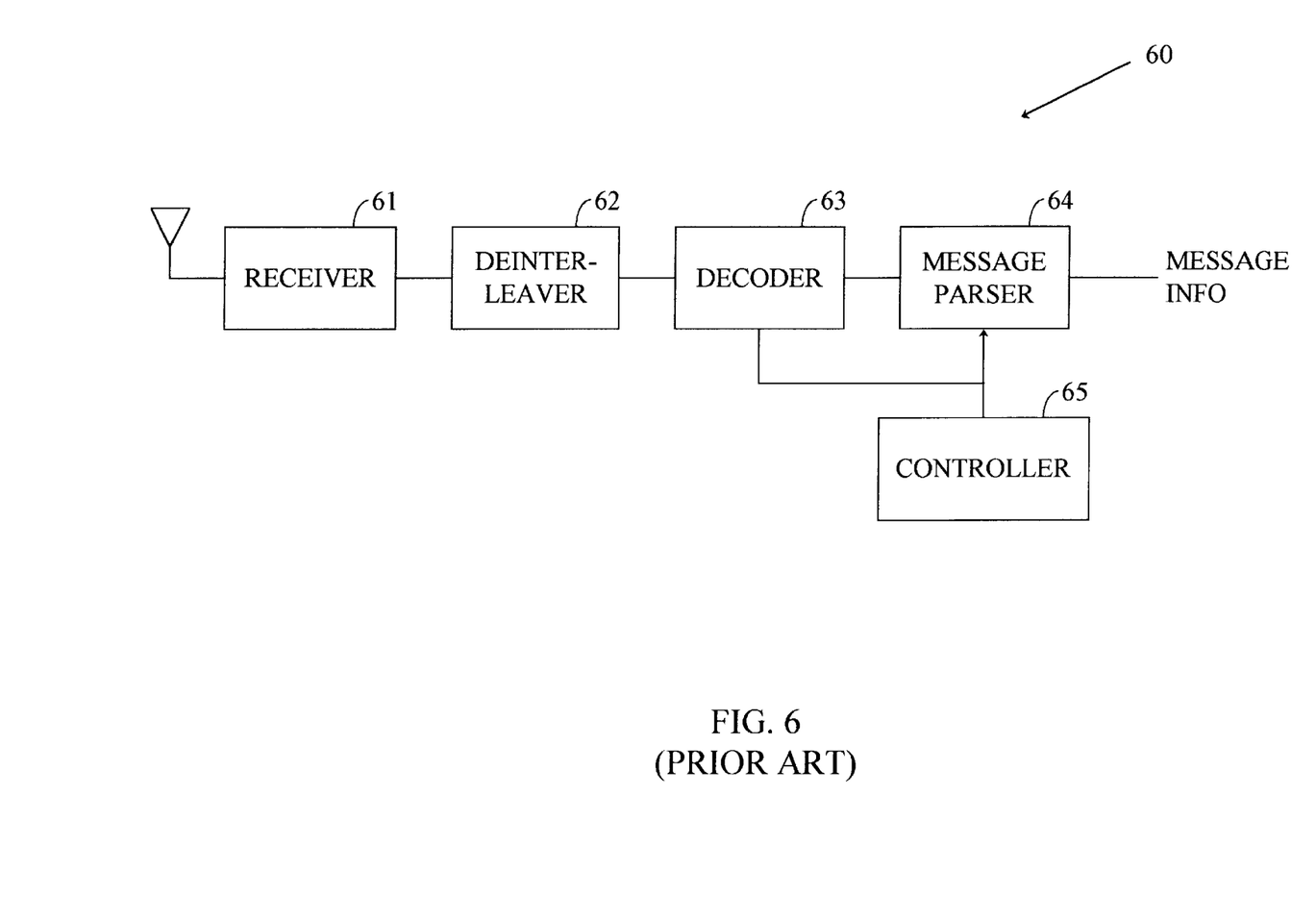
FIG. 6 is a block diagram of an embodiment of a remote unit.

FIG. 6 is a block diagram showing a portion of a remote unit 60. A receiver 61 receives wireless link signals. The receiver 61 provides for reception and down-conversion of the wireless link signal and also provides despreading in a CDMA environment, as well as other demodulation functions. The receiver 61 provides a series of digital values at its output.

According to well-known wireless link protocols, such as IS-95, before data is transmitted over the wireless link, it is divided into a series of blocks. The blocks are reordered in time such that the block order is non-time sequential as transmitted over the wireless link. This method of transmitting blocks is referred to as interleaving, and the process of reordering the blocks is referred to as deinterleaving. A deinterleaver 62 performs the deinterleaving function. The deinterleaver 62 receives samples from the receiver 61 and accumulates a series of blocks data. When an entire set of blocks has been received, the deinterleaver 62 reorders the blocks in time-sequential order and outputs them to a decoder 63.

In one embodiment, the decoder 63 is a convolutional decoder. One common form of convolutional decoders is the Virterbi decoder. As discussed above, a Virterbi decoder creates soft decision data based upon groups of data. When the decoder buffer contains sufficient data, the data is passed to a message parser 64. The message parser 64 performs such functions as collection of bits in the message, computing and verifying any cyclic redundancy code (CRC) or other error checking code, translation of the message into an internal format, copying the transformed message into a buffer, and placement of the transformed message onto a queue for the proper protocol task. In general, the processes of the decoder 63 and the message parser 64 are controlled by a controller 65. The controller can be configured upon entering the active state to bias the encoder toward specific states, or to have no bias toward any state.

In one embodiment, the decoder 63 may be implemented on an ASIC. In other embodiments the decoder 63 may be a Field Programmable Gate Array (FPGA), discrete logic, a microprocessor, or other control circuitry. In another embodiment, both the decoder 63 and controller 65 can be fabricated on the same ASIC. In other embodiments, the configuration of the hardware in the remote unit 60 may be controlled through firmware, allowing field upgrade of a remote unit by downloading new firmware.

In general, operation of the remote unit 60 is controlled by configuration of the hardware and software executed on the controller 65. The hardware configuration may be established by firmware, software, hardwiring of discrete devices or any combination of the above.

As discussed above, convolutional encoding of the input data at the base station results in the received code symbols being influenced by previous bits in the data stream. A consequence of convolutional encoding when the received code symbol stream has been interrupted is discussed below.

Figure 7:
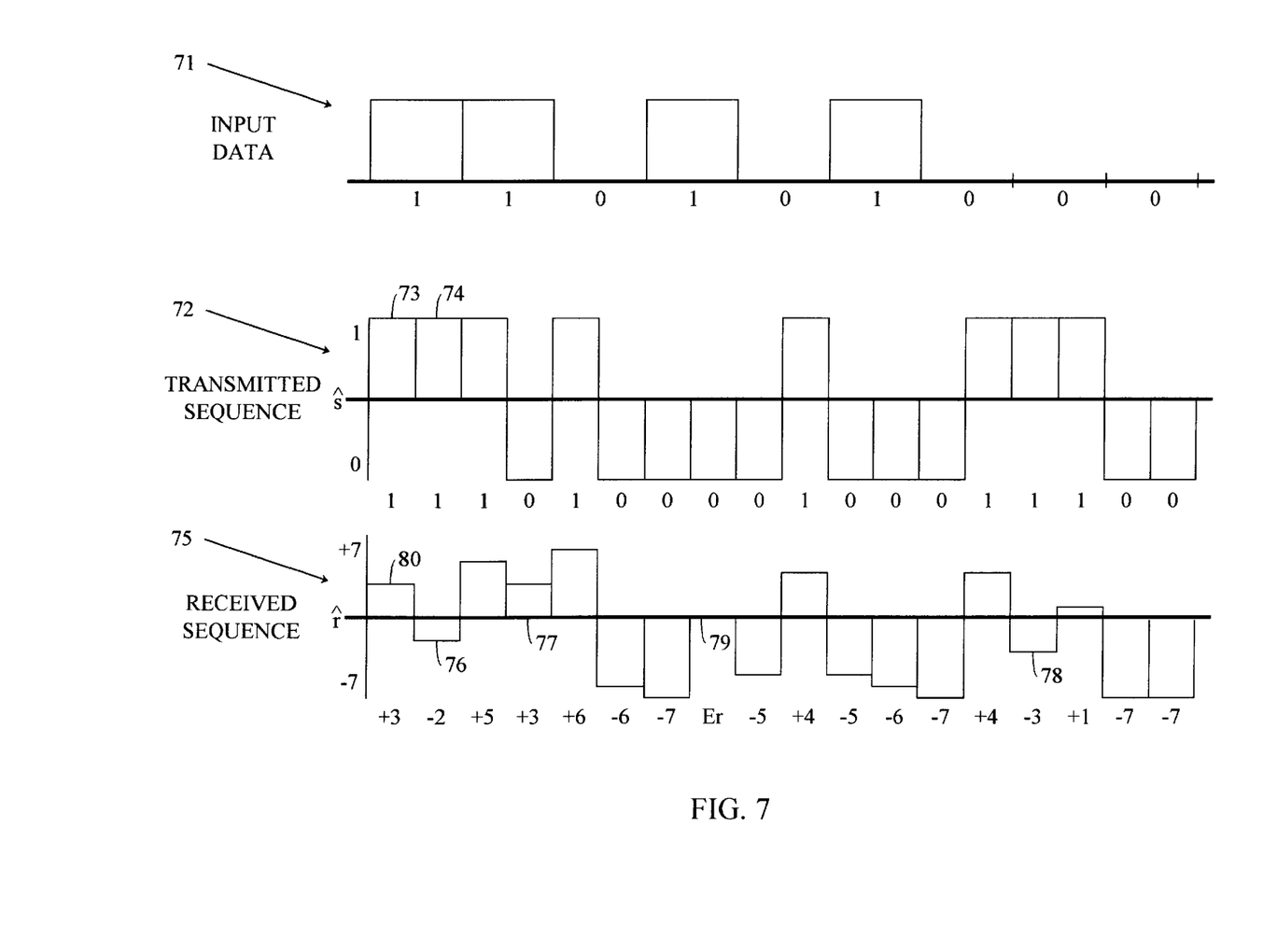
FIG. 7 is a representative diagram illustrates a convolutionally encoded sequence such as would be generated by the encoder illustrated in FIG. 3.

FIG. 7 exemplifies a simple example of a convolutional encoded sequence, such as would be generated by the encoder illustrated in FIG. 3. FIG. 7 illustrates input data 71. In this example, it is assumed that the convolutional encoder begins in its "00" state prior to receiving input data 71. As input data 71 enters the encoder, a transmitted sequence 72 is generated by the encoder. Because the convolutional encoder of FIG. 3 is a rate ½, each bit in the information sequence entered into the encoder generates two symbol codes $C_0$ and $C_1$ items 73 and 74, respectively. The sequence of code symbols is transmitted over the wireless channel where it can be corrupted by noise and fading.

In a remote unit 60 a receiver 61 receives the transmitted sequence 72. Because of the effect of the wireless channel on the transmitted sequence, such as for example noise and fading, the received sequence of code symbols may be represented by received sequence 75 of FIG. 7. In this example, the received signal is quite corrupted. Three of the received symbols 76, 77 and 78 have different polarity than the corresponding transmitted symbols. In addition, there is one erasure 79, when no data was received.

The received sequence 75 is sampled in the remote unit receiver 61. For example, the receiver 61 may integrate the energy received during a code symbol period. In one embodiment, the magnitude of the energy received during the code symbol period can be converted to a voltage level scaled between +7 to −7 volts. In this example, a strong "1" will be represented by a different value than a weak "1." A positive sign corresponds to a binary "1" and a negative sign corresponds to a binary "0." The magnitude of the voltage level is a measure of confidence that the received symbol is the same as the transmitted symbol. For example, a strong binary "0" will be represented by a negative sign and a large magnitude while a weak binary "1" will have a positive sign and a small magnitude. As an example, the first binary "1" in input data 71 enters the encoder at the base station to produced the transmit sequence of code symbols 73, 74. The code symbols were transmitted through the wireless channel. The code symbols were received at the remote unit with a confidence level of +3, −2 as illustrated by items 80 and 76, respectively. These confidence levels of the received symbol are used by the decoder in the remote unit to make soft decisions (i.e. predict the most likely path through the trellis).

Figure 8:
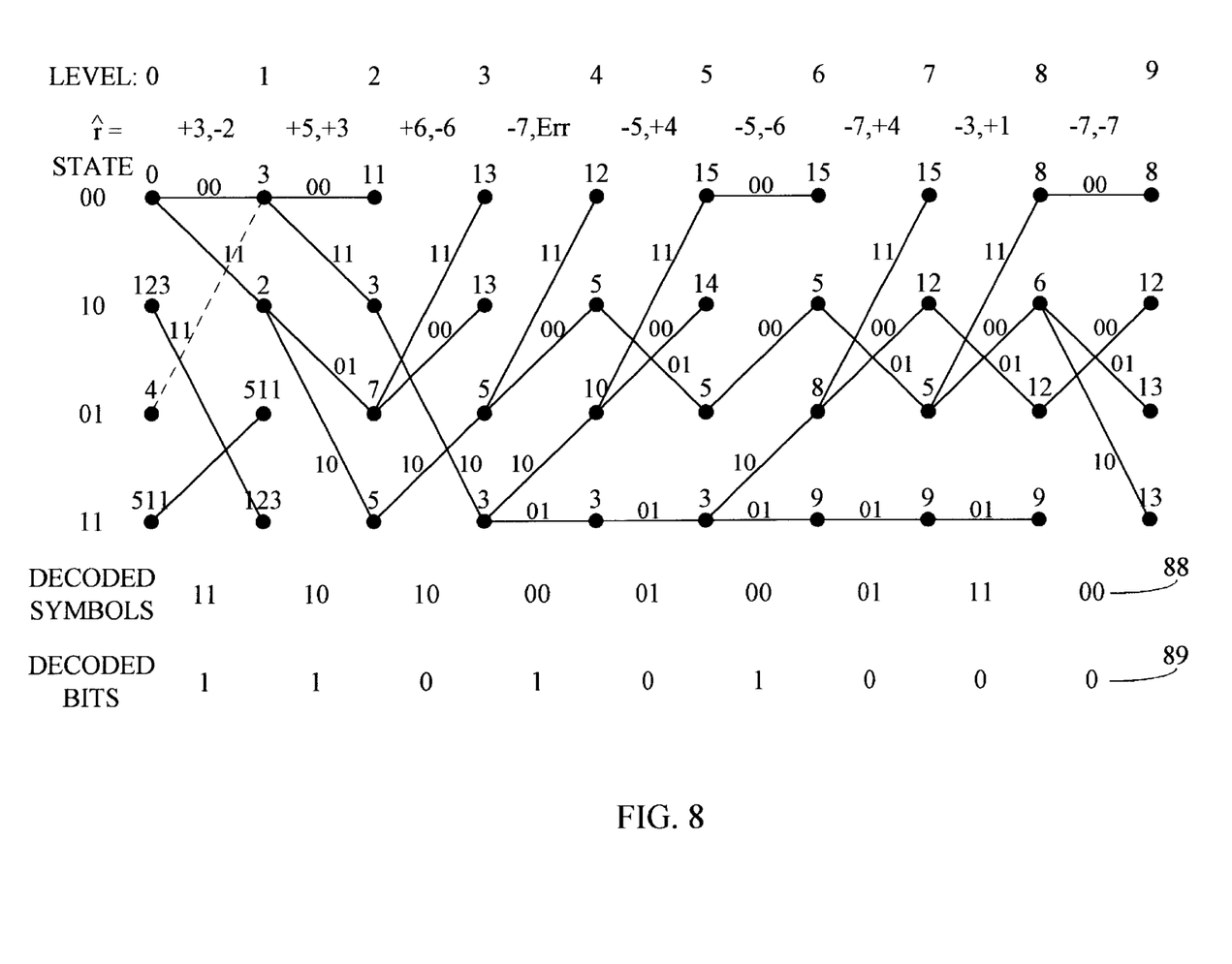
FIG. 8 is a trellis diagram illustrating the decoding of the received sequence illustrated in FIG. 7.

FIG. 8 is a trellis diagram that illustrates the decoding of the received sequence 75 illustrated in FIG. 7. Though the trellis has been simplified for ease of explanation, it will be understood that the principles explained herein are not limited to such a simple example and also apply to more complex decoders and trellises. When the remote unit is initially powered on the values of the state metrics in the Viterbi decoder initialize to an arbitrary, random, value. For example, in FIG. 8 the initial state metric values for states 00, 10, 01 and 11 are 0, 123, 4, and 511 respectively. After a block of code symbols has been received and is presented to the decoder, metrics, or confidence levels, for each of the possible states are calculated through the trellis.

For example, if the encoder begins in state 00 at level 0 and after a data bit is clocked into the encoder the encoder remains in state 00 at level 1, the data bit must have been a binary "0" producing code symbols binary 00. In the example illustrated in FIG. 8, the received symbol codes were +3 representing a binary "1" and −2 representing a binary "0". The path metric is calculated by adding the magnitudes of a confidence level that is of the opposite polarity of the required code symbols. Thus, in FIG. 8, the path metric for the transition from the initial 00 state to a 00 state at level 1 equals 3. Again referring to FIG. 4, a second path to reach a 00 state at level 1 occurs if the encoder is initially at state 01 and a binary 0 data bit had been clocked into the encoder. The encoder would have produced code symbols binary 11. If code symbols binary 11 had been transmitted, the metric for this branch would be 2. The metric of a 00 state at level 1 is calculated by adding the respective branch metrics to the state metric from the preceding state. For the example illustrated in FIG. 8, the state metric at level 1 for state 00 is either (0+3) or (4+2). Because a lower metric value corresponds to a higher probability of being the correct path, only the path that produces the lowest metric survives. Thus, in FIG. 8, only the path from state 00 at level 0 to state 00 at level 1 survives with a corresponding state metric of 3. This process continues until the trellis representing the entire block of data presented to the decoder has been built.

Once the trellis is complete the decoder performs a "chain back", tracing the path with the lowest state metric value. The decoder uses the code symbols along the "chain back" to determine the most likely transmitted sequence. In FIG. 8, the decoded sequence ending with a state metric of 8 has the highest probability of being the transmitted sequence. Chaining back through the trellis produces decoded output symbols 88 corresponding to decoded bits 89. The decoded bits 89 are an accurate representation of the transmitted bits shown in FIG. 7 as 71.

If, for example, after reaching level 9 the remote unit is commanded to enter its inactive state, the encoder would stop receiving code symbols. When the remote unit reenters its active state and begins decoding received code symbols, the new code symbols have no relationship to the path currently existing in the decoder because of the passage of time during which no code symbols were received. However, the state metrics still exist in the encoder therefore biasing the decoding chainback process.

Figure 9:
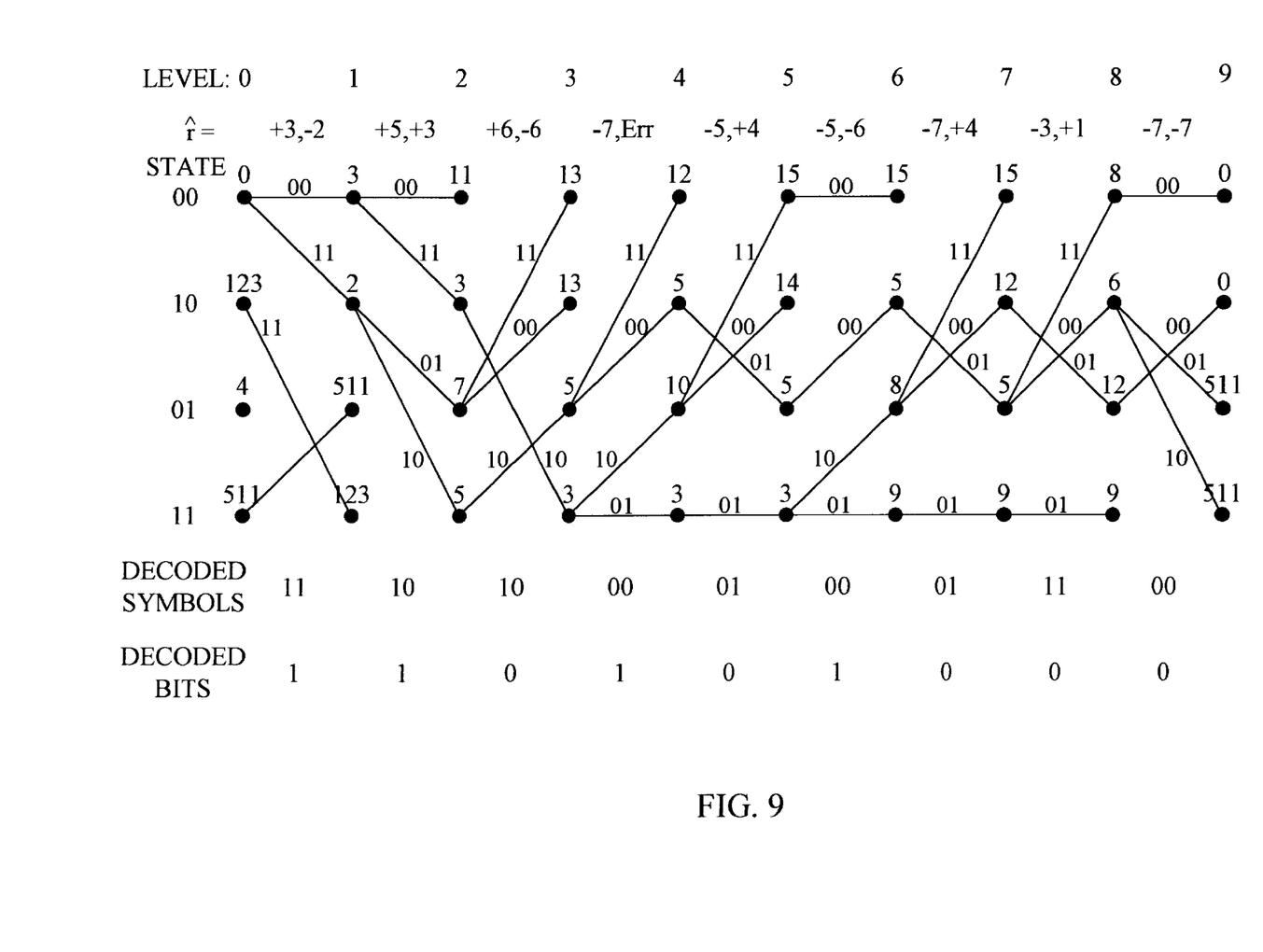
FIG. 9 is a trellis diagram illustrating one embodiment of the invention.

In FIG. 9, the same trellis as illustrated in FIG. 8 has been built from previous data. At level 9 the remote unit entered its inactive state. Upon reentering the active state, the metrics currently in the decoder are initialized. For example, the metrics corresponding to state 00 and 10 may be set to 0. The remaining metrics, to states 01 and 11 may be set to 511, or some other value corresponding to a maximum metric value. In this manner, the trellis state metrics are biased toward states 00 and 10. Biasing the trellis state metrics will favor paths which pass through these states during the chain back process.

In another embodiment, such as for example, one based on IS-95, a convolutional encoder with a constraint length of 9 and rate ½ is used to encode the data. This produces a trellis that contains 256 possible states. In a system based on IS-95-B, if the beginning of a paging channel message coincides with the beginning of a paging channel slot, a minimum of four zeros will be transmitted at the end of the previous paging channel half frame. Thus, a minimum of four zeros would have been be transmitted at the end of the previous paging channel half frame. Although the remote unit did not receive the previous block of data containing the minimum four zeros at the end of the block, if code symbols corresponding to four consecutive zeros had been input into the trellis in the decoder, only 16 out of the 256 states could be possible. In one embodiment, the metric of the 16 possible states are in initialized to a value of 0. The remaining 240 paths would be at a higher value, such as for example, a value or 511, or a maximum value. This biases the trellis towards past states that are more likely to have been there.

In another embodiment, if the beginning of a paging channel message coincides with the beginning of a paging slot, a different fixed pattern of bits may be transmitted at the end of the previous paging channel half frame. Therefore, different initialization values may correspondingly be selected. For example, if eight zeros were transmitted at the end of the previous paging channel half frame, only 1 out of the 256 states could be possible. Thus one state would be initialized to 0 and the remaining states would be initialized to a large value, such as 511.

As the above examples illustrate, the performance of a decoder can be improved by exploiting characteristics of the encoded message. As illustrated, if it can be determined what code symbols would have been received had the code symbol stream not been interrupted, based on characteristics of the received code symbols actually received, the decoder may be biased toward valid states and away from invalid states. Biasing the decoder in this manner provides a better predication of the maximum likelihood path through the trellis with less data being processed than would otherwise be required.

The foregoing can offer significant improvement over a system which leaves the state metrics in whatever state they were at when the remote unit entered its inactive state. Biasing the trellis state metrics in the decoder toward valid states and away from invalid states improves the convergence of the chain back to the highest likelihood path back through the trellis.

In another embodiment, all state metrics are initialized to 0. Therefore, when the remote unit begins receiving new code symbols, and the trellis of FIG. 9 is continued, there is not a bias towards a previous path through the decoder. In another embodiment, the state metrics may be initialized to different values.

Figure 10:
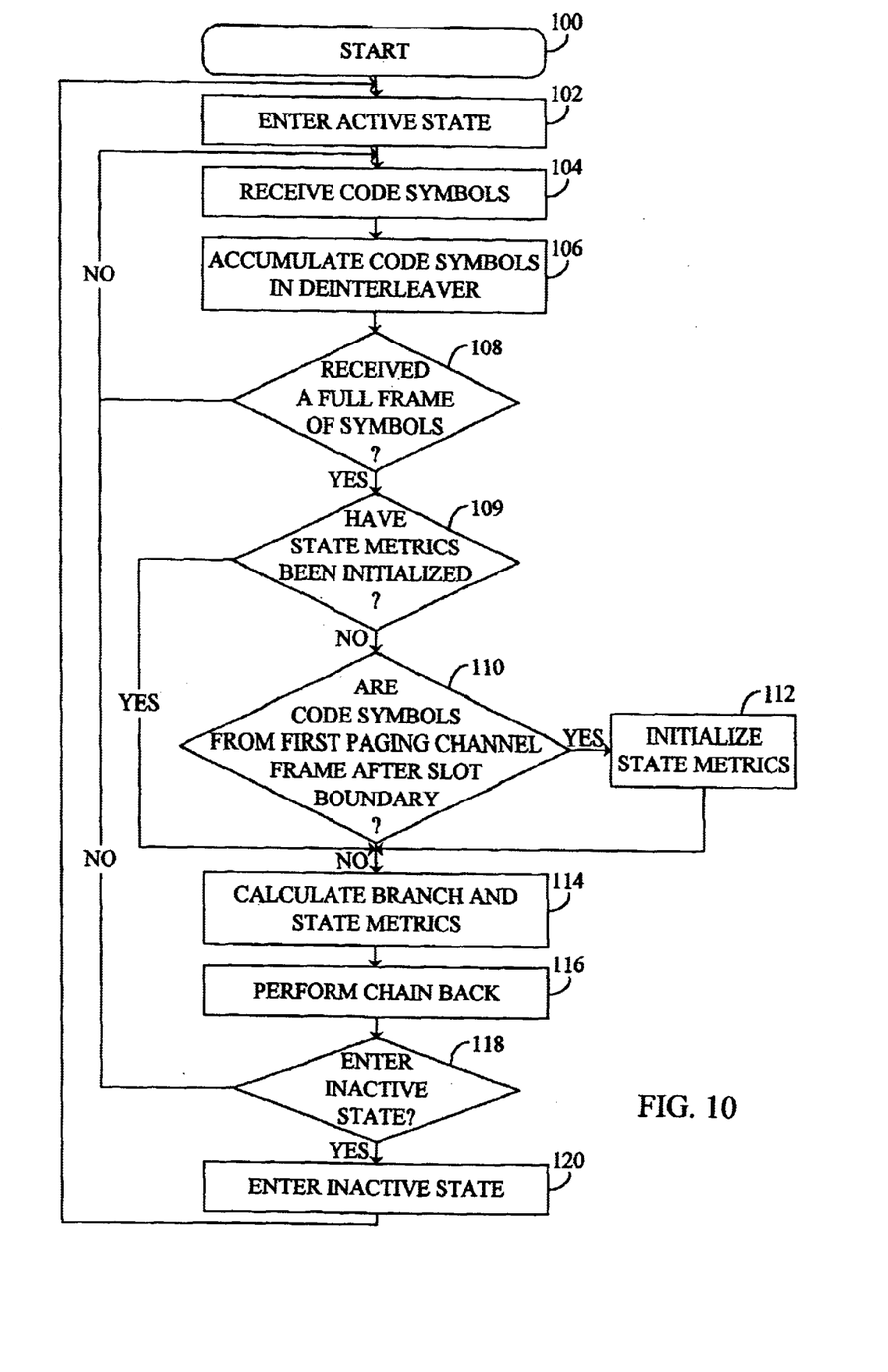
FIG. 10 is a flow chart illustrating the method of operation of one embodiment of the invention.

FIG. 10 is a flowchart representing a process for initializing a decoder. The process can be implemented using the remote depicted in FIG. 6 and can be accomplished by hardware or software. Flow starts in block 100. In block 102, the remote unit enters an active state. In block 104, code symbols are received by the remote unit. Flow then continues to block 106 where code symbols are accumulated in the deinterleaver. In block 108, it is determined if a full frame of symbols have been accumulated in the deinterleaver. If a full frame of symbols has not been accumulated in the deinterleaver, flow continues to block 104 and additional code symbols are received. Referring again to block 108, if a full frame of code symbols have been accumulated in the deinterleaver, flow continues to block 109. In block 109, it is determined if encoder state metrics have been initialized. If state metrics have been initialized, flow continues to block 114. If state metrics have not been initialized, flow continues to block 110.

In block 109, it may be determined that the state metrics have not been initialized, if for example, a handoff to a new preferred base station occurs or, as described below, the received code symbols are from the first paging channel frame after the remote units assigned slot boundary. Alternatively, the state metric will be initialized if sufficient valid code symbols, such as for example, if 232 valid code symbols (representing 116 bits), have been received by a rate ½, constraint length 9 decoder.

In block 110, it is determined whether the code symbols are from the first paging channel frame after the slot boundary. If the code symbols are from the first paging channel frame after the remote units boundary, flow continues to block 112. In block 112, state metrics are initialized. The state metrics may be initialized to any of the biases described above, such as for example, all metrics set to zero, some metrics set to zero and others set to maximum values, or other combinations. Referring again to block 110, if the code symbols are not from the first paging channel frame after the slot boundary or following initialization of the state metric, flow continues to block 114. Alternatively, in block 110, the state metric can always be initialized with flow then continuing to block 114.

In block 114, the decoder calculates branch and state metrics. After calculation of branch and state metrics in block 114, flow continues to block 116. In block 116, the decoder performs a chain back through the trellis determining the highest likelihood path through the trellis, and outputting decoded bits correspondingly. Flow then continues to block 118. In block 118, the remote unit determines whether it is entering its inactive state. If the remote unit is to remain in its active state, flow continues to block 104 and additional code symbols are received. If the remote unit is to enter its inactive state, flow continues to block 120 where the remote unit enters its inactive state. Flow then continues to block 102 where the remote unit remains, in its inactive state, until it reenters its next active state.

The foregoing description details certain embodiments of the invention. It will be appreciated, however, that no matter how detailed the foregoing appears, the invention may be embodied in other specific forms without departing from its spirit or essential characteristics. For example, although a specific decoder with a constraint layer of 3 and a rate ½ has been described. The principles apply to other encoders such as constraint length of 9 and a rate ½ or other configurations. The described embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A method of decoding convolutionally encoded data, comprising:

receiving a stream of coded symbols;

accumulating said coded symbols until a full frame of symbols has been received;

determining whether the received stream of coded symbols is an interrupted stream of coded symbols;

if the received stream of coded symbols is an interrupted stream of coded symbols, biasing end node metrics of a trellis within a convolutional decoder to valid values that would have been present from receiving an uninterrupted stream of coded symbols;

presenting said full frame of coded symbols to said convolutional decoder wherein said convolutional decoder continues construction of said trellis using said coded symbols;

computing a metric for each node on the trellis in response to said received coded symbols;

generating decoded bits in response to said metric values.

2. The method of claim 1 further comprising:
initializing said end node metrics of said trellis within said convolutional decoder to a first set of predetermined values if said symbols in said full frame are not from a first paging channel after a slot boundary.

3. The method of claim 2 wherein said initializing a metric at each end node of a trellis includes setting each said metric at each end node to zero.

4. The method of claim 3 wherein said desired number of said metric set to zero is 16.

5. The method of claim 3 wherein said desired number of said metric set to maximum value is 240.

6. The method of claim 1 wherein said initializing a metric at each end node of a trellis includes setting a desired number of said metrics to zero, and setting a desired number of each said metric at each end node to a maximum value.

7. A method of decoding a continuously convolutionally encoded stream of data for use in a remote unit in a slotted mode wireless communication system, wherein the remote unit only receives a portion of said continuously convolutionally encoded stream of symbols during an active state of said remote unit and receives none of said stream during an inactive state, the method comprises:
receiving a stream of coded symbols;
accumulating said symbols until a full frame of symbols has been received;
determining whether the received stream of coded symbols is an interrupted stream of coded symbols;
if the received stream of coded symbols is an interrupted stream of coded symbols, biasing end node metrics of a trellis within a convolutional decoder to valid values that would have been present from receiving an uninterrupted stream of coded symbols;
presenting said full frame of coded symbols to said convolutional decoder wherein said convolutional decoder continues construction of said trellis using said coded symbols;
computing a metric for each node on the trellis in response to said received coded symbols;
generating decoded bits in response to said metric values.

8. The method of claim 7, further comprising:
if said symbols in said full frame are from a first paging channel frame after a slot boundary, then initializing a metric at each end node of the trellis within the convolutional decoder to a predestined value,
wherein said initializing a metric at each end node of a trellis includes setting each said metric at each end node to zero.

9. The method of claim 7 wherein said initializing a metric at each end node of a trellis includes setting a desired number of said metrics to zero, and setting a desired number of each said metric at each end node to a maximum value.

10. The method of claim 9 wherein said desired number of said metric set to zero is 16.

11. The method of claim 9 wherein said desired number of said metric set to maximum value is 240.

12. The method of claim 7 wherein said trellis comprises 256 possible states.

13. A remote unit for use in a communication system comprising:
a receiver configured to receive wireless link signals including a stream of coded symbols;
a deinterleaver configured to receive the coded symbols from said receiver and accumulate said coded symbols into a series of data blocks ordered in a time-sequence order;
a decoder configured to receive said series of data blocks ordered in a time sequence order, continue construction of a trellis stored in said decoder to decode said data blocks and output decoded data; and
a controller configured to determine whether the received stream of coded symbols is an interrupted stream of coded symbols,
wherein if the received stream of coded symbols is an interrupted stream of coded symbols, the controller biases end node metrics of the trellis within the decoder to valid values that would have been present from receiving an uninterrupted stream of coded symbols.

14. The remote unit of claim 13 wherein the decoder is a Viterbi decoder.

15. The method of claim 13 wherein the controller initializes a metric value at each end node of said trellis prior to said decoder continuing construction of said trellis stored in said decoder if said series of data blocks are from a first paging channel frame after slot boundary and wherein said initializing a metric value at each end node of a trellis includes setting each said metric value to zero.

16. The method of claim 15 wherein said initializing a metric value at each end node of a trellis includes setting a desired number of said metric values to zero, and setting a desired number of said metric values to a maximum value.

17. The method of claim 16 wherein said desired number of said metric set to zero is 16.

18. The method of claim 16 wherein said desired number of said metric set to maximum is 240.

19. The remote unit of claim 13, wherein said trellis comprises 256 possible states.

20. A system for decoding convolutionally encoded codewords comprising:
means for receiving a stream of coded symbols;
means for accumulating said symbols until a full frame of symbols has been received;
means for determining whether the received stream of coded symbols is an interrupted stream of coded symbols;
means for biasing end node metrics of a trellis within a convolutional decoder to valid values that would have been present from receiving an uninterrupted stream of coded symbols if the received stream of coded symbols is an interrupted stream of coded symbols;
means for presenting said full set of symbols to a convolutional decoder wherein said convolutional decoder continues construction of said trellis using said symbols;
means for computing a metric for each node on the trellis in response to said received symbols; and
means for generating decoded bits in response to said metric values.

21. The system of claim 20 wherein said trellis comprises 256 possible states.

22. The system of claim 20, further comprising:
means for determining if said symbols in said full frame are from a first paging channel frame after a slot boundary, and if so then initializing a metric at each end node of a trellis within a convolutional decoder,
wherein said initializing a metric at each end node of a trellis includes setting each said metric at each end node to zero.

23. The system of claim 22 wherein said initializing a metric at each end node of a trellis includes setting a desired number of said metrics to zero, and setting a desired number of each said metric at each end node to a maximum value.

24. The system of claim 23 wherein said desired number of said metric set to zero is 16.

25. The system of claim 23 wherein said desired number of said metric set to maximum value is 240.

26. The system of claim 20 wherein said convolutional decoder is a Viterbi decoder.

* * * * *

UNITED STATES PATENT AND TRADEMARK OFFICE
CERTIFICATE OF CORRECTION

| | | |
|---|---|---|
| PATENT NO. | : 6,665,832 B1 | |
| APPLICATION NO. | : 09/539852 | |
| DATED | : December 16, 2003 | |
| INVENTOR(S) | : Neufeld et al. | |

It is certified that error appears in the above-identified patent and that said Letters Patent is hereby corrected as shown below:

Column 14, Claim 15, line 15, replace "method" with --remote unit--.

Column 14, Claim 16, line 22, replace "method" with --remote unit--.

Column 14, Claim 17, line 26, replace "method" with --remote unit--.

Column 14, Claim 18, line 28, replace "method" with --remote unit--.

Signed and Sealed this
Ninth Day of October, 2012

David J. Kappos
*Director of the United States Patent and Trademark Office*